United States Patent
Yamaguchi et al.

(10) Patent No.: US 7,307,254 B2
(45) Date of Patent: Dec. 11, 2007

(54) SCANNING ELECTRON MICROSCOPE

(75) Inventors: Kohei Yamaguchi, Hitachinaka (JP);
Kazuo Aoki, Hitachinaka (JP); Seiji Isogai, Hitachinaka (JP); Masashi Sakamoto, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 249 days.

(21) Appl. No.: 11/103,654

(22) Filed: Apr. 12, 2005

(65) Prior Publication Data

US 2005/0236569 A1   Oct. 27, 2005

(30) Foreign Application Priority Data

Apr. 19, 2004 (JP) .............. 2004-122668

(51) Int. Cl.
*G01N 23/00* (2006.01)
*G01N 21/00* (2006.01)

(52) U.S. Cl. .............. 250/311; 250/207; 250/310; 356/237.1

(58) Field of Classification Search ........ 250/310–311; 356/237.1–237.2; 438/14
See application file for complete search history.

(56) References Cited

U.S. PATENT DOCUMENTS

| | | | | |
|---|---|---|---|---|
| 3,958,078 A | * | 5/1976 | Fowler et al. | 348/127 |
| 5,189,481 A | * | 2/1993 | Jann et al. | 356/73 |
| 5,985,680 A | * | 11/1999 | Singhal et al. | 438/7 |
| 6,067,164 A | * | 5/2000 | Onoguchi et al. | 356/401 |
| 6,122,562 A | * | 9/2000 | Kinney et al. | 700/121 |
| 6,255,127 B1 | * | 7/2001 | Fujino et al. | 438/16 |
| 6,368,763 B2 | * | 4/2002 | Dirksen et al. | 430/30 |
| 6,567,713 B2 | * | 5/2003 | Lichtenstein et al. | 700/58 |
| 6,829,035 B2 | * | 12/2004 | Yogev | 355/30 |
| 6,850,646 B1 | * | 2/2005 | Silver et al. | 382/199 |
| 6,897,445 B2 | * | 5/2005 | Nakada et al. | 250/310 |
| 2006/0091309 A1 | * | 5/2006 | Oosaki et al. | 250/310 |

FOREIGN PATENT DOCUMENTS

| | | |
|---|---|---|
| JP | 11-167893 | 6/1999 |
| JP | 2000-200813 | 7/2000 |
| JP | 2002-039959 | 2/2002 |

* cited by examiner

*Primary Examiner*—Gregory J. Toatley, Jr.
*Assistant Examiner*—Jarreas Underwood
(74) *Attorney, Agent, or Firm*—McDermott Will & Emery LLP

(57) ABSTRACT

This SEM has a capability of preventing shift of a view field of the foreign matters at a stage where no sufficient correction is carried out when obtaining the SEM coordinate values used for transforming the coordinate values of the foreign matters on the sample sent from another device into the SEM coordinate values. The SEM selects the foreign matters closer to the center of the sample at first and then the foreign matters spirally from the center of the sample to the outer periphery.

8 Claims, 7 Drawing Sheets

SCANNING ELECTRON MICROSCOPE

BACKGROUND OF THE INVENTION

1. Field of the Invention

The present invention relates to a scanning electron microscope which enables to observe a fine object to be measured, the object being located on the surface of a sample. More particularly, the present invention relates to the scanning electron microscope which is arranged to transform the coordinate data of an object to be observed, the object being located on a sample measured by another foreign matter inspector into the data fitted for the coordinate system of itself and then to utilize the converted data when observing an object.

2. Description of the Related Art

A scanning Electron Microscope (often but not always referred to as an SEM) is used for observing a fine structure of a sample in various fields of research and development. The SEM operates to display on screen an SEM image of an object to be observed when observing the object. This technology is applied to observation of a microstructure of a semiconductor device. As a semiconductor device becomes finer, today, the semiconductor device is manufactured with a pattern width of 150 nm or less. In such a semiconductor device, some troubles may take place even if a foreign matter or a defect with as short a width as about several tens nm is located on a wafer used for producing semiconductor patterns. For checking foreign matters or defects that bring about troubles in detail, the SEM is required to observe the foreign matters and the defects. Hereafter, the foreign matters and/or defects are collectively referred simply to as the defects.

For observing such a fine defect with the SEM, it is common to measure where a defect is located on a wafer, search the defect based on the coordinate data obtained by the measurement, and observe the defect through the use of another inspector device such as an optical wafer visual inspector device or an SEM system wafer visual inspector device both of which specify where a defect is located on a wafer with an optical or electron probe. For example, in the case of observing a defect of about 0.2 µm with the SEM, it is necessary to magnify the defect by 5000 times at minimum and display the magnified image of the defect on the SEM screen. However, since the observatory range at one watch is limited by the range of the SEM screen size, if the coordinate data of the defect obtained by the defect inspector device is too much erroneous, the defect may be shifted out of the SEM screen. For example, in the case of observing a defect at a resolution of 10000 times through the use of the SEM with the SEM screen consisting of 150 nm×150 nm, the range of the SEM image to be observed at a watch consists of 15 µm×15 µm. Hence, if the coordinate data sent from the defect inspector device contains an error of ±7.5 µm or more, the defect is shifted out of the SEM screen, so that the defect cannot be found out.

Today, the semiconductor inspector device, representatively the defect review SEM improves its inspecting capability of a defect and thus is required to automatically inspect any kind of defect on any kind of wafer, determine a type of defect, and process data about the defect. In particular, therefore, when observing a defect, if the defect is shifted out of the SEM screen, the process is interrupted or a field of view is moved in the periphery of the SEM screen for inspecting the defect again. Both of the cases need a massive length of time for this inspection. It means that a large number of wafers cannot be inspected efficiently.

Hence, it is necessary to correct the coordinate value of the defect sent from another defect inspector device in consideration of errors such as a difference of a coordinate system of the device, an offset shift of a wafer, a shift of rotation, and a dimensional accuracy error of a coordinate shaft. As a method of correcting the coordinate values, as disclosed in JP-A-11-167893, the SEM inspection takes the method of building correcting expressions with parameters for correcting factors, selecting a plurality of defects used for correction, obtaining the coordinate values sent from the another defect inspector device and the coordinate value on the wafer to be measured, determine the parameters of the correcting expressions from those coordinate values, and correcting all defects located on the wafer.

However, when moving to a location of a defect for obtaining the coordinate value of the defect used for correcting the coordinate value, at an initial state where the coordinate value is not sufficiently corrected, the defect may be shifted out of the view field of the microscope. In particular, when driving the SEM without humans in attendance, if the inspection is executed correctly, the process is interrupted or needs a massive length of time. Hence, the defect cannot be detected efficiently and for a short time.

For preventing the defect from being shifted out of the view field, therefore, frequently, the coordinate values of all the defects are corrected each time a defect is selected and measured. However, the influence of an error taking place in the coordinate value of the defect selected particularly at the initial stage of correction may become an obstruct to the proper correction so that the other defects may be shifted out of the view field. For example, at a first watch, the type of error cannot be grasped, so that the shift amount is subtracted from the coordinate value as the correction.

In a case that the shift amount influences the overall wafer because of shifting the location of the wafer in parallel to the coordinate axis of the wafer coordinate system, by performing the correction of the shift, it is possible to detect the defect without shifting out of the view field at a second or later watch. However, if the shift is brought about by the rotation, the way of shift of the center of the wafer is different from that of the outer periphery of the wafer. Hence, if the first selected point is located on the outer periphery, on the center of the wafer, the defect may be shifted out of the view field. Even if a quite large shift is observed, provision of a plurality of measured coordinate data allows the observed point to be excluded for improving accuracy. At an initial stage, however, it cannot be grasped that the shift amount to be measured is exceptional on the overall wafer.

As described above, at the initial state of correction, the trend for a correction of the coordinate value cannot be grasped and thus the correction is executed in light of the coordinate value. Hence, if the error is extremely large, the correction may put the defect out of the view field. For correcting the coordinate values of all the defects located on the wafer, it is necessary to select the defect used for the correction from the overall wafer uniformly or without shifting to a specific area. Hence, in some methods of selecting a defect, the SEM is often moved on the wafer between the ends, which needs a long time for correcting the coordinate value.

In consideration of the foregoing disadvantages, it is an object of the present invention to provide a method of selecting a defect which method is arranged to simply and efficiently transform the coordinate data of a defect sent from a defect inspector device into the coordinate data of an SEM.

SUMMARY OF THE INVENTION

In carrying out the object, according to an aspect of the invention, an SEM is provided with means for selecting a defect used when a coordinate error operating unit determines a coordinate correcting expression used for fine adjusting a coordinate linkage required for observing a defect located on the surface of a wafer to be observed on the basis of the coordinate information sent from another defect inspection device through the use of an electron beam.

The SEM is also provided with a function of selecting an object to be observed on a sample in the substantially spiral direction in the direction of coming far off the center of the sample, assuming a defect closer to the center of a sample as a first selecting point, when selecting a defect used in the coordinate error operating unit. The shift caused by the rotation of the wafer is the smallest on the center of the wafer and is made larger toward the outer periphery of the wafer. Since flex or expansion and contraction is made larger in the direction from the center to the outer periphery of the wafer, the dimensional accuracy error of the wafer coordinate system caused by the flex or the expansion and contraction is made larger in the foregoing direction. Hence, around the center of the wafer, the offset error caused by the shift of the installing position of the wafer has the greatest influence, while the other error has a smaller influence. By selecting a defect around the center of the wafer at first, therefore, it is possible to lessen the erroneous correction. As stated above, the error of the coordinate value that is made larger in the direction of the center to the outer periphery thereof does not have so great an influence around the center of the wafer. As a result, by selecting an object to be observed on a sample substantially spirally in the direction of the center to the outer periphery thereof, it is possible to reduce the influence of the error of the coordinate system and the frequency of the shift of the selected defect out of the view field of the microscope. In this case, it is preferable to provide setting means so that the user may set conditions of selecting a defect on the wafer such as a movement of a microscope stage or a variation of the movement when selecting the defect spirally, a condition of terminating selection of a defect, and a size and a form of an object defect.

That is, the present invention concerns with the SEM which includes a stage of holding and moving a sample and a function of moving the stage to corrected coordinates in the corrected coordinate system obtained by transforming the coordinate value of the wafer coordinate system about the defect on the wafer obtained by another device through the use of coordinate system transforming expressions. Further, the SEM has a function of selecting a defect to be used for the coordinate system transforming expressions.

Further, the defect selecting means is characterized in that the defect located on the wafer and closer to the center of the wafer is a first defect to be selected and then the object to be observed on the wafer is selected spirally in the direction of the center to the outer periphery of the wafer. The SEM is provided with the function of manually or automatically setting the operating condition of the obtaining means.

The wafer coordinate transforming expressions are characterized to reduce into a minimum an error between the coordinate values in the wafer coordinate system about plural defects located on the wafer, obtained by another defect inspector device, and the coordinate values in the wafer coordinate system of the scanning electronic microscope on which the concerned defects are actually observed. Further, the wafer coordinate transforming expressions are characterized to transform the wafer coordinate system about the defects located on the wafer, obtained by another inspection device, into the wafer coordinate system of the SEM and the stage coordinate system of the sample stage.

For correcting the coordinate value of a defect, it is possible to prevent erroneous correction at the initial stage and thereby correct a coordinate value of a defect so that the erroneous correction may be reduced and the defect may be within the range of the view field. Further, by selecting defects spirally, it is possible to reduce a moving distance between the selected defects without having to lower the correction accuracy, thereby being able to improve the inspection speed.

Other objects, features and advantages of the invention will become apparent from the following description of the embodiments of the invention taken in conjunction with the accompanying drawings.

DESCRIPTION OF THE EMBODIMENTS

First Embodiment

Figure 1:
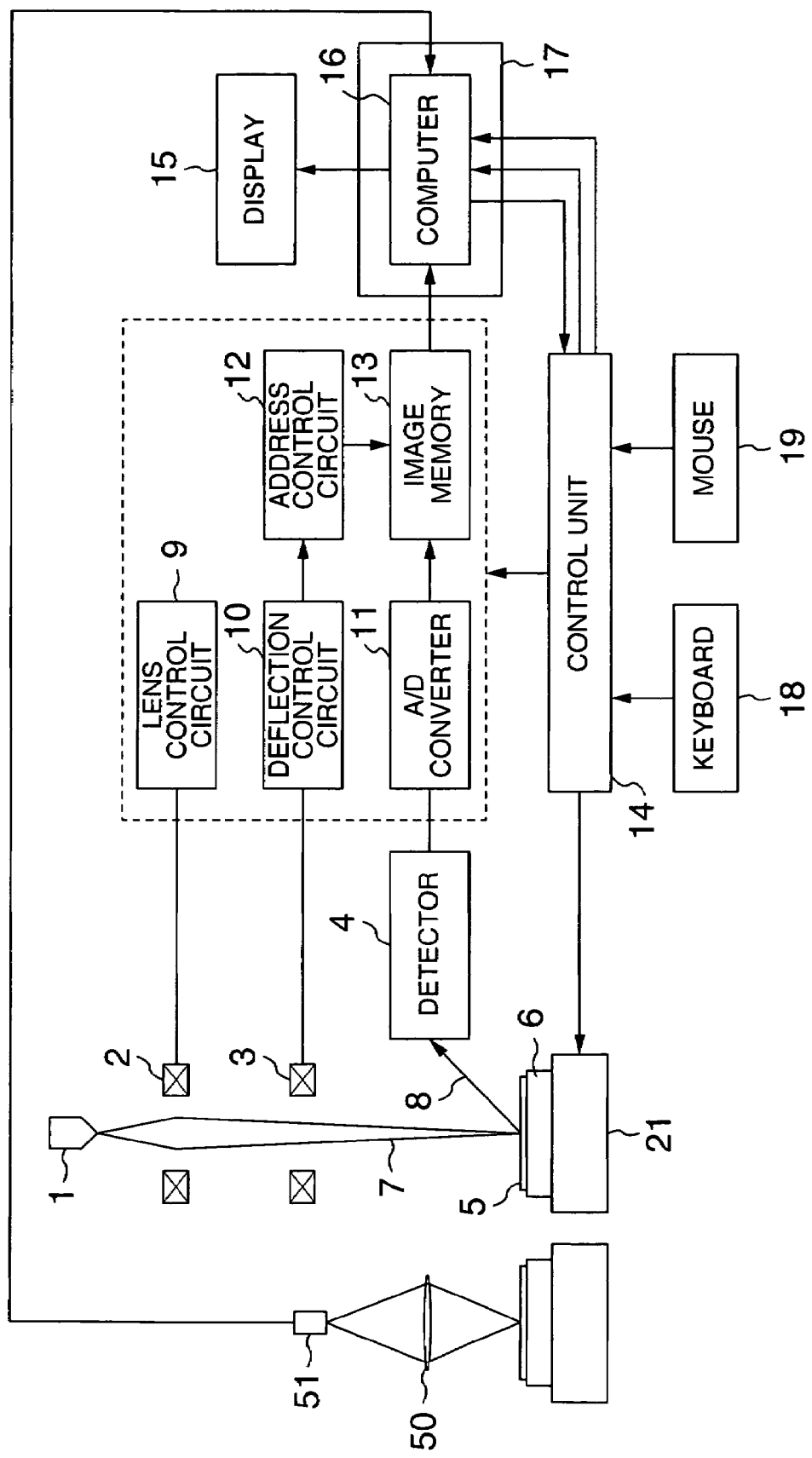
FIG. 1 is a diagram showing an SEM according to the present invention.

Hereafter, the embodiment of the present invention will be described in detail with reference to the accompanying drawings. FIG. 1 shows an arrangement of an SEM according to the first embodiment of the invention. Though the description will be expanded with the SEM as an example, the image of an optical imaging device may be used for this arrangement. In this case, a bright field optical system image or a dark field optical system may be used therefor. Moreover, it is possible to selectively use these images. For example, when first specific points are selected, the bright field or the dark field optical system image may be used. Later, the SEM image may be used. In this case, by using the image of the optical system imaging device with a wide image area, the first great offset between the coordinate systems may be executed more effectively and for a shorter time. The optional combination of them is made possible.

The SEM shown in FIG. 1 is arranged to have an electron gun 1, an electron lens 2, a lens control circuit 9, a deflection coil 3, a deflection control circuit 10, a secondary-electron particle detector (referred simply to as a detector) 4, an A/D converter 11, an address controller 12, an image memory 13, a controller 14, a display 15, a computer 16, an image synthesizer 17, and an input unit such as a keyboard 18 and a mouse 19.

The electron beam 7, fired from the electron gun 1, is converged through the electron lens 7. The deflector 3 scans and deflects the converged electron beam in the secondary manner and then applies the deflected electron beam onto a sample 5. When the electron beam 7 is applied onto the sample 5, the secondary particles 8 of the reflected or the secondary electrons take place according to the form and the material of the sample 5. These secondary particles 8 are detected and amplified by the detector 4 and then are converted into the digital value by the A/D converter 11. The converted digital value is stored in the image memory 13. As the address of the image memory 13 for the digital value, the address controller 12 generates the address in synchronous to the scan signal of the electron beam. Further, the image memory 13 occasionally transfers the image data of the stored SEM image to the image synthesizer 17. The image synthesizer 17 synthesizes the screen data stored in a display memory of a computer 16 with the image data. The synthesized image is displayed on the display 15 in real time.

The sample 5 to be observed by the SEM is held by a sample platform 6. A moving stage 21 causes the sample platform to move three-dimensionally, that is, in parallel, slantingly and rotationally in response to a control signal sent from the controller 14 so that the scanning location of the electron beam 7 may be changed with respect to the sample 5. The SEM is provided with an optical imaging device composed of an imaging optical system 50 and a CCD (Charge Coupled Device) system 51. By locating the moving stage 21 below the optical imaging device in response to the control signal sent from the controller 14, the sample 5 (wafer) can be imaged by the CCD camera 51. Further, by processing the image signal obtained by the CCD camera 51, it is possible to detect the location (posture) of the sample 5 located on the platform 6.

Figure 2:
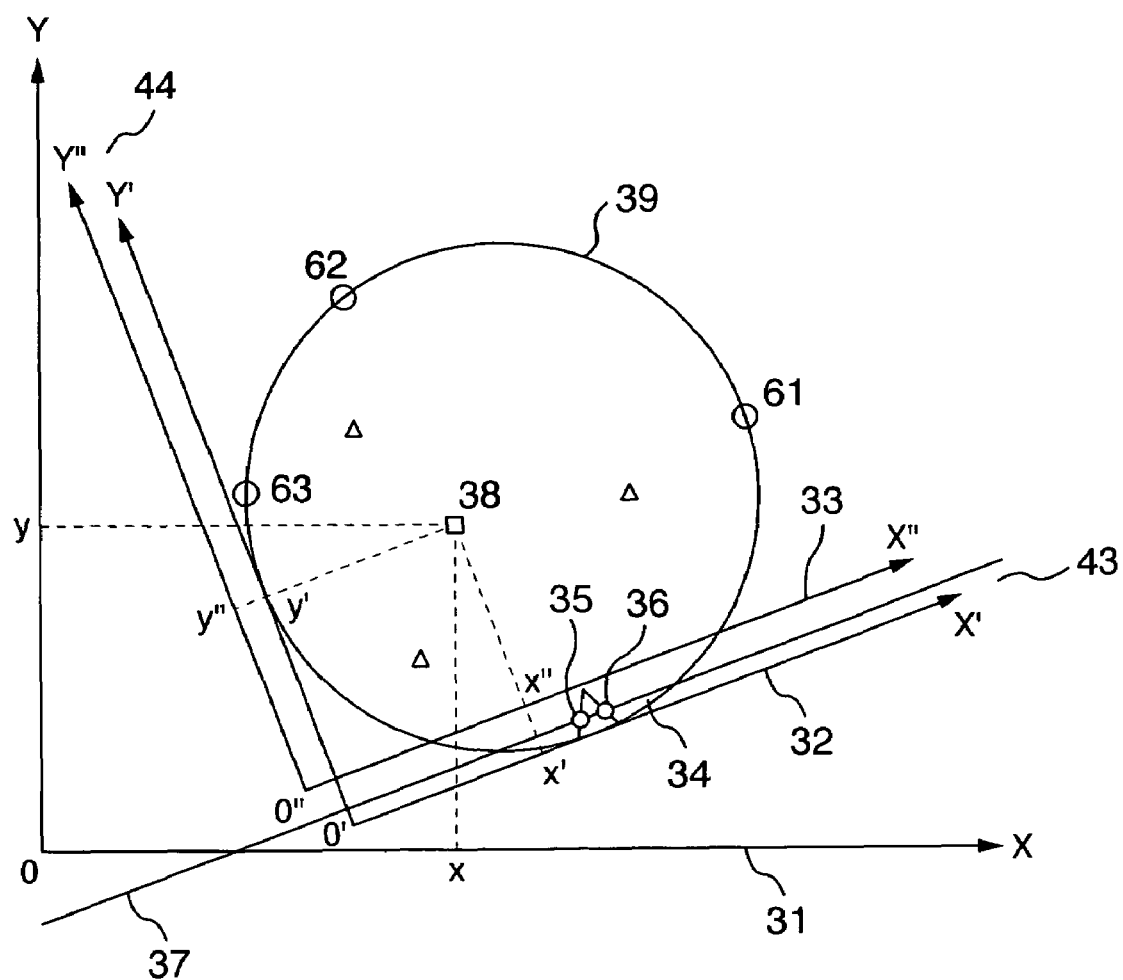
FIG. 2 is an explanatory view showing locational relation between a wafer coordinate system and a stage coordinate system of the SEM according to the present invention.

FIG. 2 shows relation between the wafer coordinate system and the stage coordinate system of the SEM. The stage coordinate system is proper to the SEM itself. In the shown relation, the stage coordinate system 31 has as a reference the moving origin point 0 of the moving stage 21. Though the stage coordinate system 31 is proper to the SEM itself and is constantly constant independently of the form and the state of the sample wafer, the coordinate system 31 cannot be shared with another inspection device.

On the other hand, the wafer coordinate system is defined to the form of a wafer. As shown in FIG. 2, in the wafer coordinate system 32 on the semiconductor inspector device, an X axis 43 is a straight line which comes into contact with an extension of an outer circumference of the wafer and is in parallel to a straight line 37 connecting the end points 35 and 36 of a V-shaped cutaway with each other, while a Y axis 44 is a straight line which comes into contact with the outer shape 39 of the wafer and is perpendicular to the X axis 43. The coordinate system may be uniquely defined with respect to the same wafer. That is, wherever the wafer may be located with respect to the moving stage, the constant coordinate axes may be constantly defined with respect to the wafer. It means that the use of the same wafer makes it possible for different devices to theoretically share the coordinate values of the same wafer coordinate system. The V-shaped cutaway called a V notch is formed to uniquely define the location of the wafer. Instead, a straight cutaway called an "orientation flat" may be used. Further, it is assumed that the wafer coordinate system 30 of the defect inspection device is defined similarly to the wafer coordinate system 32 described above.

However, as described below, since the coordinate-transformed result is reflected on the wafer coordinate system, for example, the wafer coordinate system 33 in which the offset of an origin point is corrected corresponds to the original wafer coordinate system 32 moved by the offset. Hence, before correcting the coordinate, the coordinate values of a defect 38 is the values based on the wafer coordinate system 32, that is, (X', Y'), while after correcting the coordinates, the coordinate value of a defect 38 is changed into the value based on the wafer coordinate system 33, that is, (X", Y"). On the other hand, the coordinate value of the defect 38 on the stage coordinate system 31 constantly keeps the coordinate value (X, Y) before and after correcting the coordinate value.

When registering the coordinate value of a defect detected, therefore, the present invention is arranged to register the coordinate value (X'Y") on the currently used wafer coordinate system or the coordinate value (X", Y") on the corrected wafer coordinate system as well as the coordinate value (X, Y) on the stage coordinate system that does not depend upon the coordinates-corrected result, that is, the coordinate value that is effective after the coordinates are corrected. The function of registering (storing) the coordinate values of the defects on the wafer and the stage coordinate systems is realized by the software run within the computer 16, for example.

Figure 3:
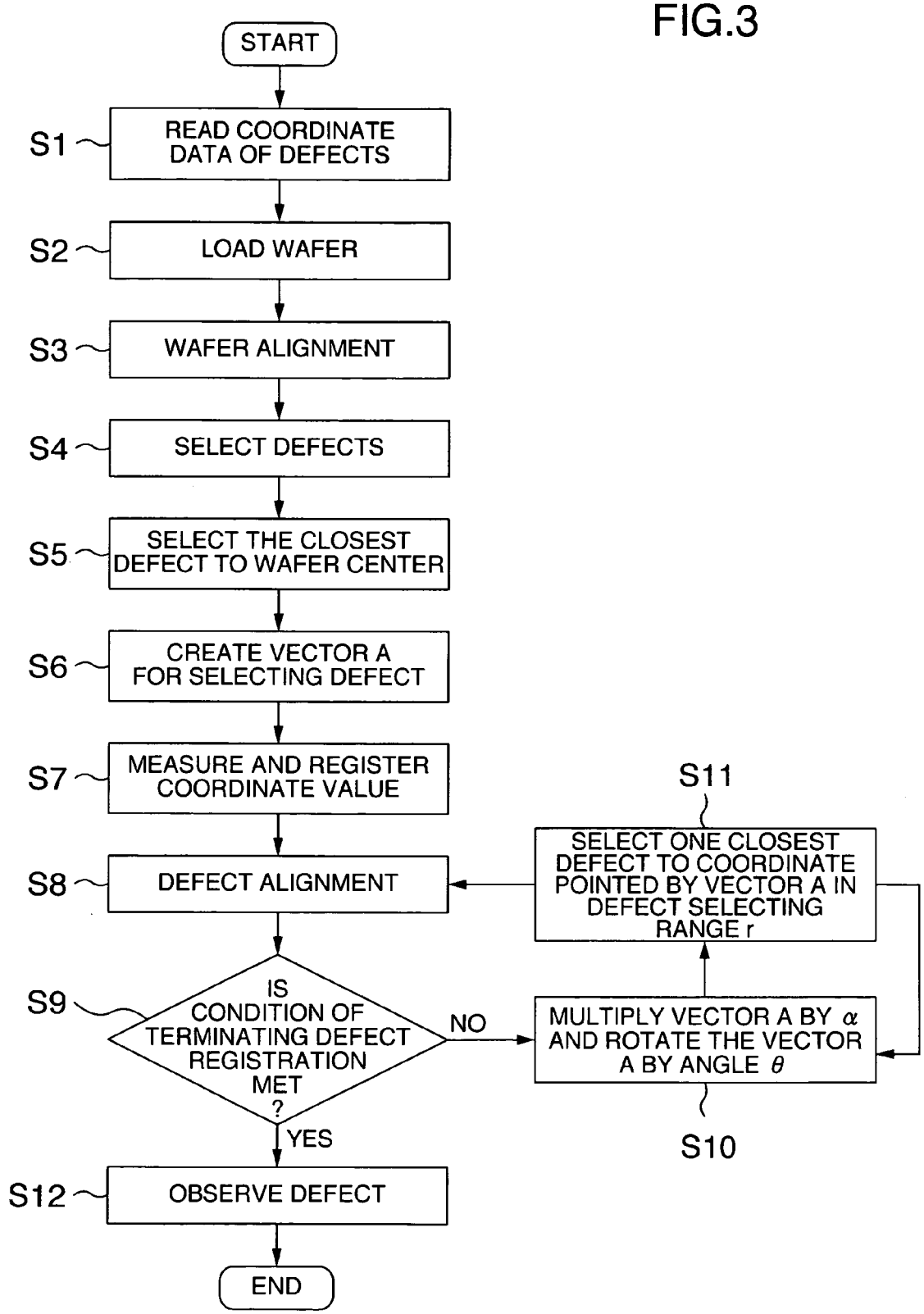
FIG. 3 is a flowchart illustrating the process of observing a defect on a wafer through the use of the semiconductor SEM according to a first embodiment of the present invention.

FIG. 3 is a flowchart showing the process of observing a defect on a wafer through the use of a semiconductor SEM. In advance of the step shown in FIG. 3, the coordinates of a defect on a wafer are measured by using the defect inspection device. For representing the location of the defect, basically, like the SEM, the wafer coordinate system is used. In actual, however, a slight error generally takes place between the coordinate system of the defect inspection device and that of the SEM.

In a step S1 shown in FIG. 3, the coordinate data of a defect measured by the defect inspection device is read into the SEM. The coordinate data is passed from the defect inspection device to the SEM through an external storage unit such as a floppy disk or a magneto-optical disk or a network. Proceeding to a step S2, the wafer on which a defect is measured by the defect inspection device is loaded on the SEM. The step S2 may be located before the step S1.

Figure 4:
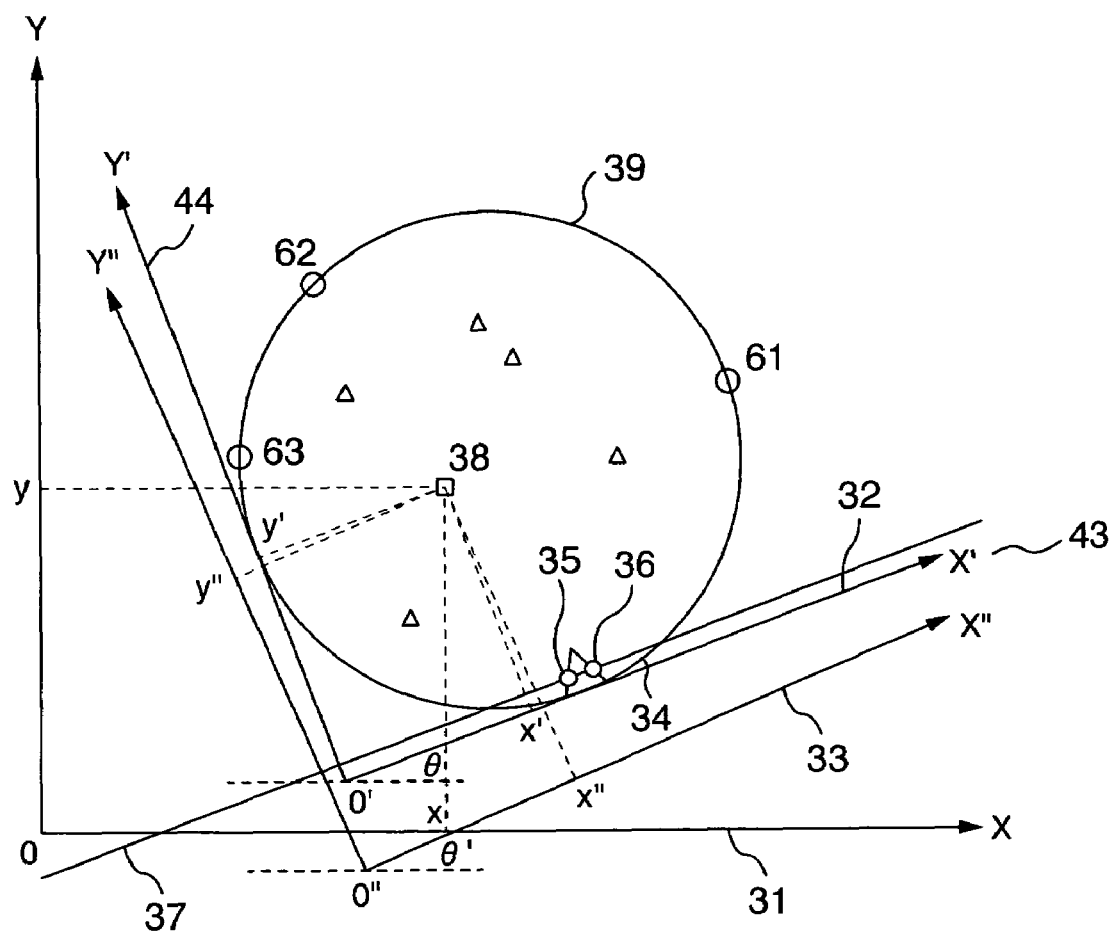
FIG. 4 is an explanatory view showing relation among the stage coordinate system, the wafer coordinate system and the transformed wafer coordinate system according to the present invention.

In the wafer alignment in the step S3, the process is executed to measure the coordinates of an outer peripheral points of the wafer held on the moving stage 21 located in the SEM for checking the location (posture) of the wafer with respect to the stage coordinate system. Concretely, as shown by a broken line in FIG. 1, the moving stage 21 on which the wafer is held is caused to move below an optical imaging device composed of the imaging optical system 50 and the CCD camera 51. Then, as shown in FIG. 4, as to five points on the outer periphery 39 of the wafer, that is, two points 35 and 36 on the V notch and three points 61 to 63 on the wafer outer circumference, the coordinates of those points on the stage coordinate system are measured. Based on those coordinate values, the X axis 43 of the wafer coordinate system is defined as a straight line that comes into contact with the wafer coordinate system 33, that is, the extension of the wafer circumference and is in parallel to the straight line 37 connecting the end points 35 and 36 of the V notch with each other, and the Y axis 44 of the wafer coordinate system is defined as a straight line that comes into contact with the wafer circumference 39 and is perpendicular to the X axis 43. The definitions of the X axis 43 and the Y axis 44 result in defining the wafer coordinate system 32.

Proceeding to a step S4, a process is executed to select a defect candidate to be used for correcting the coordinate system in the subsequent steps. The defect inspection device supplies the coordinate data of detected defects as well as the data about the size and the type of each defect classified by a number and a symbol. For selecting a defect to be used for deriving the coordinate transforming expression, by using the classifying data supplied by this defect inspection device, it is preferable to select a defect to be used for correcting the coordinate system in the subsequent steps in advance. For example, the process is executed to display on an operation screen of the SEM a screen of setting a defect condition to be used for deriving the coordinate transforming expression so that a user may point to an upper limit of a size of a defect to be registered on the coordinate system and a type of a defect to be excluded with a mouse or a keyboard. Unless required, this step may be skipped.

Next, in a step S5, the process is executed to select a defect registered at the closest location to the center of the wafer from the defects selected in the step S4. Concretely, in FIG. 5, the process is executed to derive the center location 70 of the wafer from a diameter of the wafer, calculate a distance between the center location and each defect to be inspected, and select the defect with the shortest distance. The process of the step S5 is executed by the operating unit for operating the center location of the wafer and the other operating unit for calculating a distance between the wafer center and each defect or between the defects, comparing them with each other, and deriving the minimum value based on the comparison. These operating units may be realized by the software run in the computer 16, for example.

Then, in a step S6, a vector a for selecting a defect is created. Any method may be used for the method of defining a vector. As an example, a vector is created in the direction from the center location 70 of the wafer to the location of the defect selected in the step S5.

Proceeding to a step S7, based on the coordinate data about defects sent from the defect inspection device or the coordinate data about defects of the defect inspection device corrected in the preceding step (the coordinate data about defects on the below-discussed wafer coordinate system 33), the moving stage is moved to the location of the selected defect for measuring the coordinate values on the wafer coordinate system 32 and the stage coordinate system 31 as in the SEM. For moving the stage to the location of the defect, it is necessary to point to the coordinate value of the stage coordinate system based on the coordinate data of the defect on the wafer coordinate system. For transforming the coordinate data on the wafer coordinate system 30 of the defect inspection device or the coordinate data of the coordinate-transformed wafer coordinate system 33 of the semiconductor inspection device into the coordinate data on the stage coordinate system 31 as in the SEM, as shown in FIG. 4, it is possible to transform the coordinate data of the wafer coordinate system 30 of the defect inspection device or the corrected coordinate values (x1, y1) on the wafer coordinate system 33 of the SEM into the coordinate value (x2, y2) on the stage coordinate system through the effect of the expression 1 as indicated below.

$$\begin{pmatrix} x_2 \\ y_2 \end{pmatrix} = \begin{pmatrix} \cos\theta & -\sin\theta \\ \sin\theta & \cos\theta \end{pmatrix} \begin{pmatrix} x_1 \\ y_1 \end{pmatrix} + \begin{pmatrix} a \\ b \end{pmatrix}$$ [Expression 1]

wherein the parameters θ, a and b are rotation errors of the wafer coordinate system and the stage coordinate system and an offset error, all of which are derived by the wafer alignment executed in the step S3.

Based on the coordinate value obtained as described above, the moving stage is moved to the location of the defect. Then, the process is executed to register the coordinate value ($x_2$, $Y_2$) of the defect measured on the wafer coordinate system 32 of the SEM with no correction and the coordinate value (x, y) of the defect measured on the stage coordinate system 31. If no defect is found in the moved location, the defect located therearound is detected as the corresponding defect with the coordinate data, and the coordinate value of that defect is registered.

In this process, for the screen portion with patterns, the method of detecting the location of a defect is provided with a function of comparing a screen portion on which one or more defects exist at the location of patterns with a screen portion where no defect exists at the location of the same patterns through the effect of an image processor and recognizing the location of the defect as the difference of a form and a contrast between the portion where the defect exists and the portion where no defect exists. For the screen portion with no patterns, the detecting method is provided with a function of automatically detecting the difference of a form and a contrast between a-defect and a portion around the defect through the image processor and measuring the location of the defect based on the detected difference. In addition, an operator, if any, may manually specify a location by moving a cursor to the location on the screen, for example.

Based on the coordinate data obtained in the step S7, in a step S8, the process is executed to correct the coordinate values of all defects (to align all defects) on the wafer coordinate system 32 of the SEM before correction. In this correcting process, the parameters of θ", a and b indicated in the expression 2 are determined so as to reduce into a minimum a sum of errors between the corrected coordinate value ($x_2$, $Y_2$) obtained by substituting the coordinate value ($x_1$, $y_1$) of the defect inspection device into the below-indicated expression 2 and the coordinate value ($X_3$, $y_3$) of the defect on the wafer coordinate system 32 of the SEM measured in the step S7. For example, the sum of errors may be reduced into a minimum by means of the least-squares method or the like. The parameter of θ" corresponds to an angular error of θ-θ' between the wafer coordinate systems 32 and 33 as shown in FIG. 4.

$$\begin{pmatrix} x_2 \\ y_2 \end{pmatrix} = \begin{pmatrix} \cos\theta'' & \sin\theta'' \\ -\sin\theta'' & \cos\theta'' \end{pmatrix} \begin{pmatrix} x_1 \\ y_1 \end{pmatrix} + \begin{pmatrix} a \\ b \end{pmatrix}$$ [Expression 2]

In the case of measuring the coordinate values of plural defects, the parameters of θ", a and b indicated in the expression 2 are determined so as to reduce into a minimum the error between ($X_3$, $y_3$) and ($x_2$, $y_2$) with respect to all the measured defects.

After those parameters are determined, the coordinate value on the wafer coordinate system 30 of all the defects are transformed through the use of the expression 2, in which preferably, the vector a is used for the new wafer coordinate system 33 transformed by the expression 2 without transforming the coordinate value of the vector a, though this is not essential.

In a step S8, the process is realized by means for calculating a coordinate error between the devices, means for determining constants of a coordinate transforming expression, and creating the coordinate transforming expression, and means for transforming the coordinate value sent from the defect inspection device into the coordinate values for the SEM through the created coordinates transforming expression. Each of those means may be realized by the software run in the computer 16, for example.

It is preferable that the process of the step S8 is executed each time the registered defect is detected for the purpose of enhancing the accuracy of detection. This process may be executed each time a certain number of defects are selected or after all the selected defects are detected.

In the following step S9, it is determined if the registration of one or more defects used for correcting the coordinate values is terminated. Based on the determined result, the following step is determined. As the terminating conditions, the registration is terminated when the specified number of defects to be measured are compared with the number of measured defects and both of the numbers are made equal to each other in the compared result or when the error of the coordinate value between the wafer coordinate system 32 of the SEM measured in the step S7 and the wafer coordinate system 33 thereof is calculated and the error is made lower than the prescribed value in the compared result. The means of setting the condition of terminating the defect registration as described above may be realized by the process of displaying the setting screen about the condition of terminating the obtention of defects on the operating screen of the SEM and then specifying the terminating condition and the parameters about the terminating condition, for example, the number of defects to be detected and the error range of the coordinate values with a mouse or a keyboard. About the registration of defects, based on the condition of terminating the registration of defects set by a user in advance, the registration may be automatically terminated according to the setting condition or an operator may terminate the registration on any timing.

Figure 5:
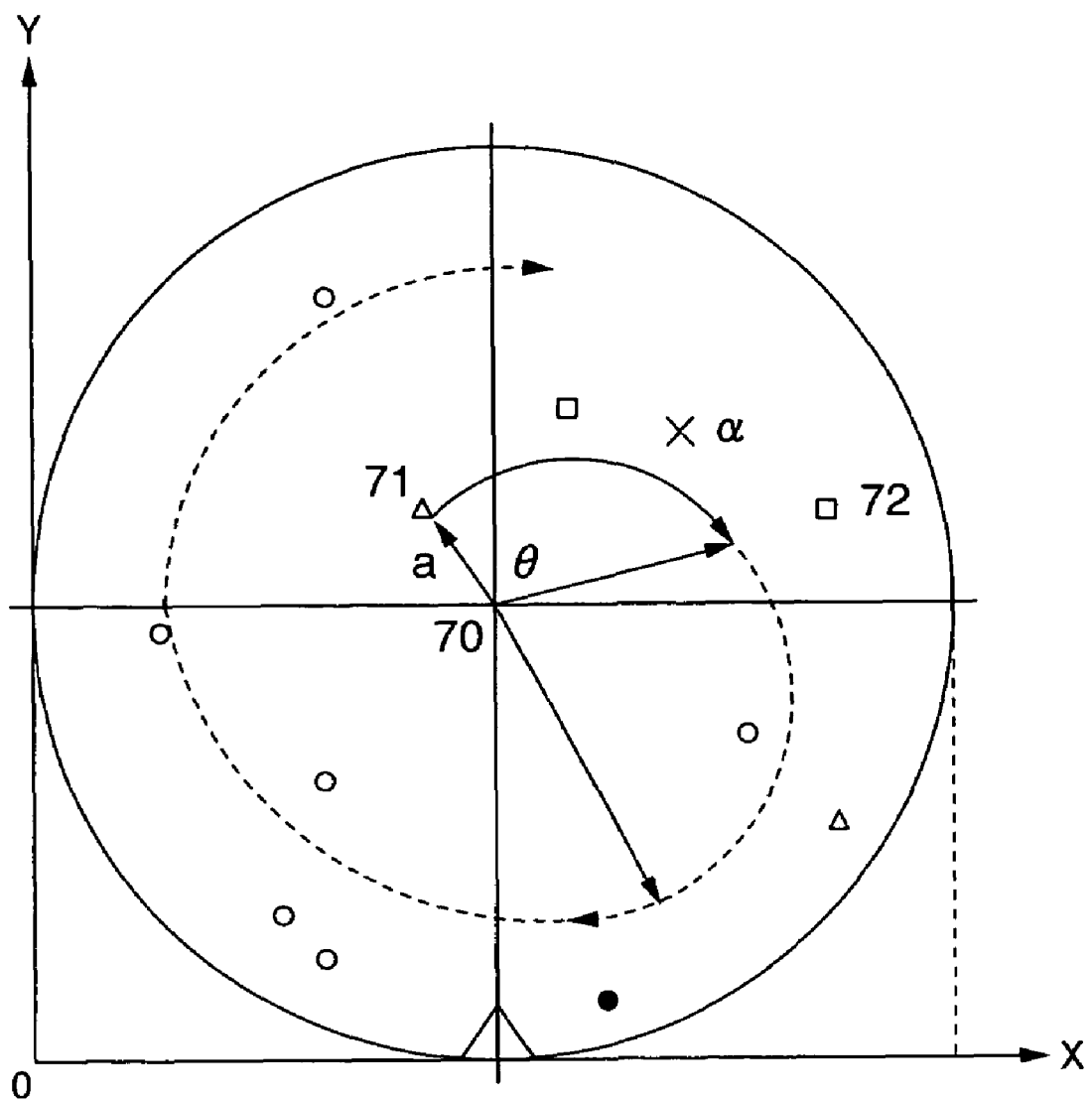
FIG. 5 is an explanatory view showing the method of selecting a defect according to the first embodiment of the present invention.

If the condition of terminating the registration is not met in the step S9, the process of a step S10 is executed. In the step S10, as shown in FIG. 5, the vector a is rotated by an angle θ for creating an α-fold vector. The created vector is newly specified as a vector a. As an example, it is possible to refer to θ=360°/n (n is an integer of 4 to 8) and α=(L/A)(1/n) (L is a wafer radius and A is a length of the vector a determined at first), though those values are not definitive. Further, the angle θ and a magnification α are not necessarily fixed and may be varied according to a certain condition. For example, the magnification α is multiplied by the vector a after the vector a is rotated once. Further, it is possible to set the condition of making the angle θ larger as closer to the outer periphery of the wafer. Moreover, the computer 16 may be supplied with an input screen in which the angle θ and the magnification α may be inputted with a keyboard or a mouse, so that the user may set the condition in advance. In this operation, it is convenient to allow the user to make sure of the trace of the vector a on the screen.

Proceeding to a step S11, the process is executed to select a defect never selected in the past from the defects located closest to the end point of the vector a determined in the step S10. If no defect never selected in the past is found within the range of the radius r from the end point of the vector a, it is preferable to execute the process of the step S10 once again without selecting any defect. However, another condition may be adopted in which a proper defect is searched again within the range of a wider radius than r. Further, the range r is derived by r=L/10 (L is a radius of a wafer). However, this range r is not definitive. Like the parameters of θ and α, the range r may be variable in the constant condition. Afterwards, the process goes back to the step S8. Until the condition of terminating the registration of defects is met, the process of the steps 8 to 11 is repeated. The operation of the coordinate values of the vector a, the setting of the parameters θ and α and the range r, which are included in the process of the steps S10 and S11, and the distance comparing means and the defect selecting means, which are included in the process of the step S11, are all executed by the computer 16. Further, the setting of those parameters is automated through the effect of the function of setting those parameters based on the condition of setting the defect selecting means, the history of the parameters for prescribing the condition of setting the defect selecting means, the information about defects such as distribution of defects, and the information about the defect inspection device.

If the condition of terminating the registration of defects is met in the step S9, in the following step S12, the defects are observed. The process is executed to transform the coordinate value sent from the defect inspection device on the wafer coordinate system 33 newly defined by the coordinates correcting expression, search the defects, and then observe the defects on the SEM image. When the defect is moved to the center of the view field of the microscope, the coordinate value on the wafer coordinate system 33 of the semiconductor SEM is transformed into the coordinate values on the stage coordinate system 31 through the effect of the foregoing expression 1, and then the stage is moved to the transformed coordinate values. In this case, about the defects used in correcting the coordinates in the steps S5 to S11, it is possible to use the coordinate value on the wafer coordinate system 33 transformed by the coordinates correcting expression. In actual, it is preferable to use the coordinate value on the stage coordinate system 31 registered in advance.

The aforementioned description has concerned with the method of transforming the wafer coordinate system 30 of the defect inspection device into the wafer coordinate system 33 of the SEM for inspecting a semiconductor. Conversely, the wafer coordinate system 32 of the SEM for inspecting a semiconductor may be transformed into the wafer coordinate system 30 of the defect inspection device. In this case, the parameters θ', a' and b' indicated in the below-described expression 3 are determined in a manner to reduce to a minimum an error between the corrected coordinate value $(X_2', Y_2')$, transformed from the value $(x_2, Y_2)$ on the wafer coordinate system 30 of a defect measured in the step S7 through the effect of the below-described expression 3, and the corresponding coordinate value $(x_1, y_1)$ of the defect inspection device. Also in this case, in the case of measuring the coordinate values of plural defects, the parameters of the expression 3 are determined in a manner to reduce into a minimum an error between $(x_2, Y_2)$ and $(x_2', Y_2')$ with respect to all the measured defects. In this case, as shown in FIG. 5, the coordinate value $(x_2', Y_2')$ on the transformed wafer coordinate system 33 of the defect inspection device is transformed into the stage coordinate system 31 of the semiconductor inspection SEM through the effect of the expression 4.

$$\begin{pmatrix} x_2' \\ y_2' \end{pmatrix} = \begin{pmatrix} \cos\theta' & \sin\theta' \\ -\sin\theta' & \cos\theta' \end{pmatrix} \begin{pmatrix} x_2 \\ y_2 \end{pmatrix} + \begin{pmatrix} a' \\ b' \end{pmatrix} \qquad \text{[Expression 3]}$$

-continued $$\begin{pmatrix} x_1 \\ y_1 \end{pmatrix} = \begin{pmatrix} \cos\theta & \sin\theta \\ -\sin\theta & \cos\theta \end{pmatrix} \begin{pmatrix} x'_2 \\ y'_2 \end{pmatrix} + \begin{pmatrix} a \\ b \end{pmatrix}$$ [Expression 4]

The aforementioned description has concerned with only the offset error and the rotation error of the coordinate system. If another error factor is included, the similar correction may be executed. As an example, consider an offset error, a rotation error, a dimension accuracy error of an X axis and a Y axis of the wafer coordinate system, all of which occur between the wafer coordinate system of the defect inspection device and that of the semiconductor inspection SEM. In this case, for executing the correction, the parameters indicated in the expression 5 are determined in a manner to reduce into a minimum an error between the coordinate value transformed from the coordinate value on the wafer coordinate system 30 of the defect inspection device through the effect of the expression 5 and the corresponding measured coordinate value on the wafer coordinate system 32 of the semiconductor inspection SEM.

$$\begin{pmatrix} x \\ y \end{pmatrix} = \begin{pmatrix} m(\cos\beta + \sin\beta\tan\alpha) & -\frac{n\sin\beta}{\cos\alpha} \\ m(\sin\beta - \cos\beta\tan\alpha) & \frac{n\cos\beta}{\cos\alpha} \end{pmatrix} \begin{pmatrix} x_1 \\ y_1 \end{pmatrix} + \begin{pmatrix} c \\ d \end{pmatrix}$$ [Expression 5]

wherein $(x_1, y_1)$ denotes defect coordinates of the defect inspection device, $(x, y)$ denotes defect coordinates of the SEM, $(c, d)$ denotes an origin point 10 offset between the coordinate systems, $\alpha$ denotes an orthogonal error of the wafer coordinate system, $\beta$ denotes an angular error between the coordinate axes, m denotes a dimension accuracy error of an X axis, and n denotes a dimension accuracy error of a Y axis.

Further, those expressions are not fixed. For example, the expressions to be used for correction may be selected according to the number of defects to be selected. That is, the expressions may be selectively changed so that the optimal correction may be carried out. In addition, the foregoing expressions are exemplary. In some cases, it is effective to provide the correcting expression with another correcting term.

Second Embodiment

The method of selecting defects shown in the steps S5, S6, S10 and S11 may be changed as follows. This changed method is shown in the flowchart of FIG. 6.

Figure 6:
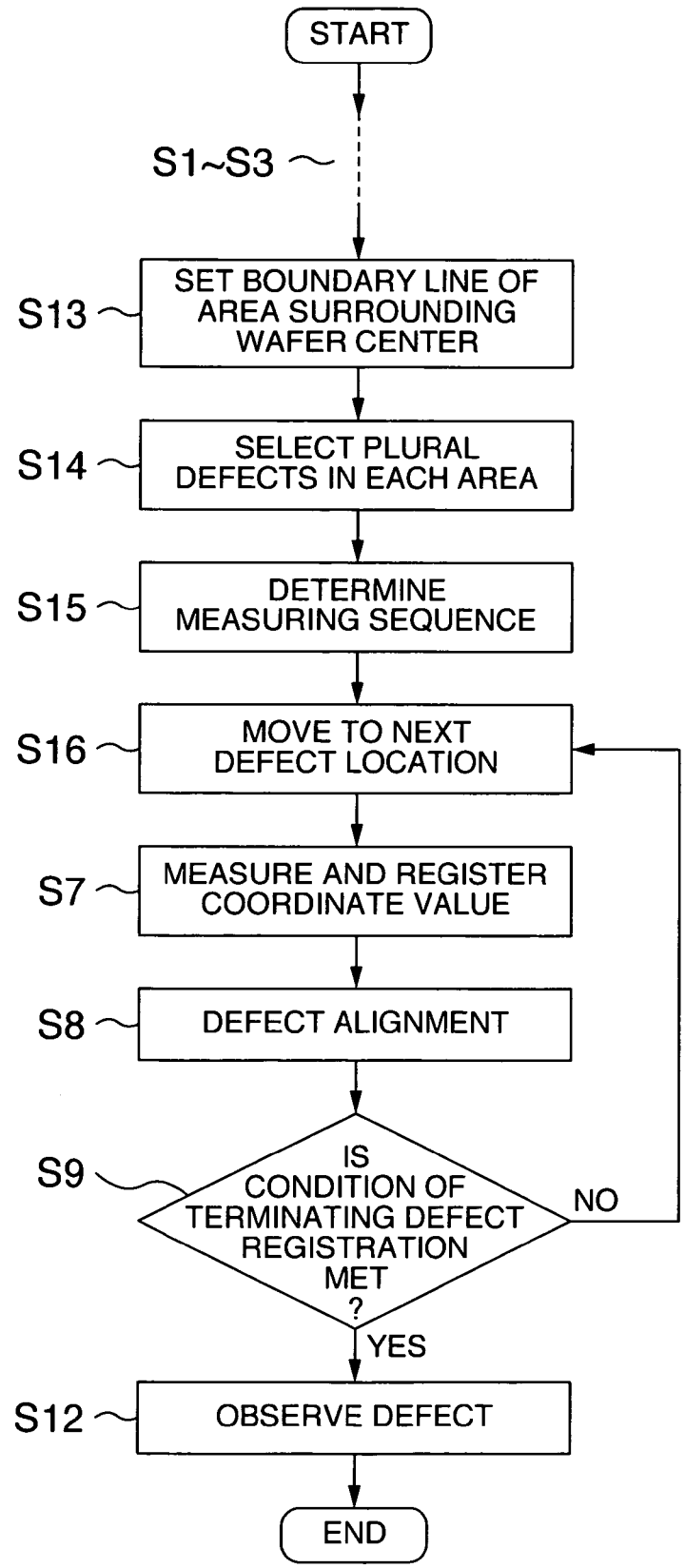
FIG. 6 is a flowchart illustrating the process of observing a defect on a wafer through the use of a semiconductor SEM according to a second embodiment of the present invention.

In FIG. 6, the process of the steps S1 to S3 is executed at first. This is the same as the process of the steps S1 to S3 included in the first embodiment. Hence, the details of the process is left out.

Figure 7:
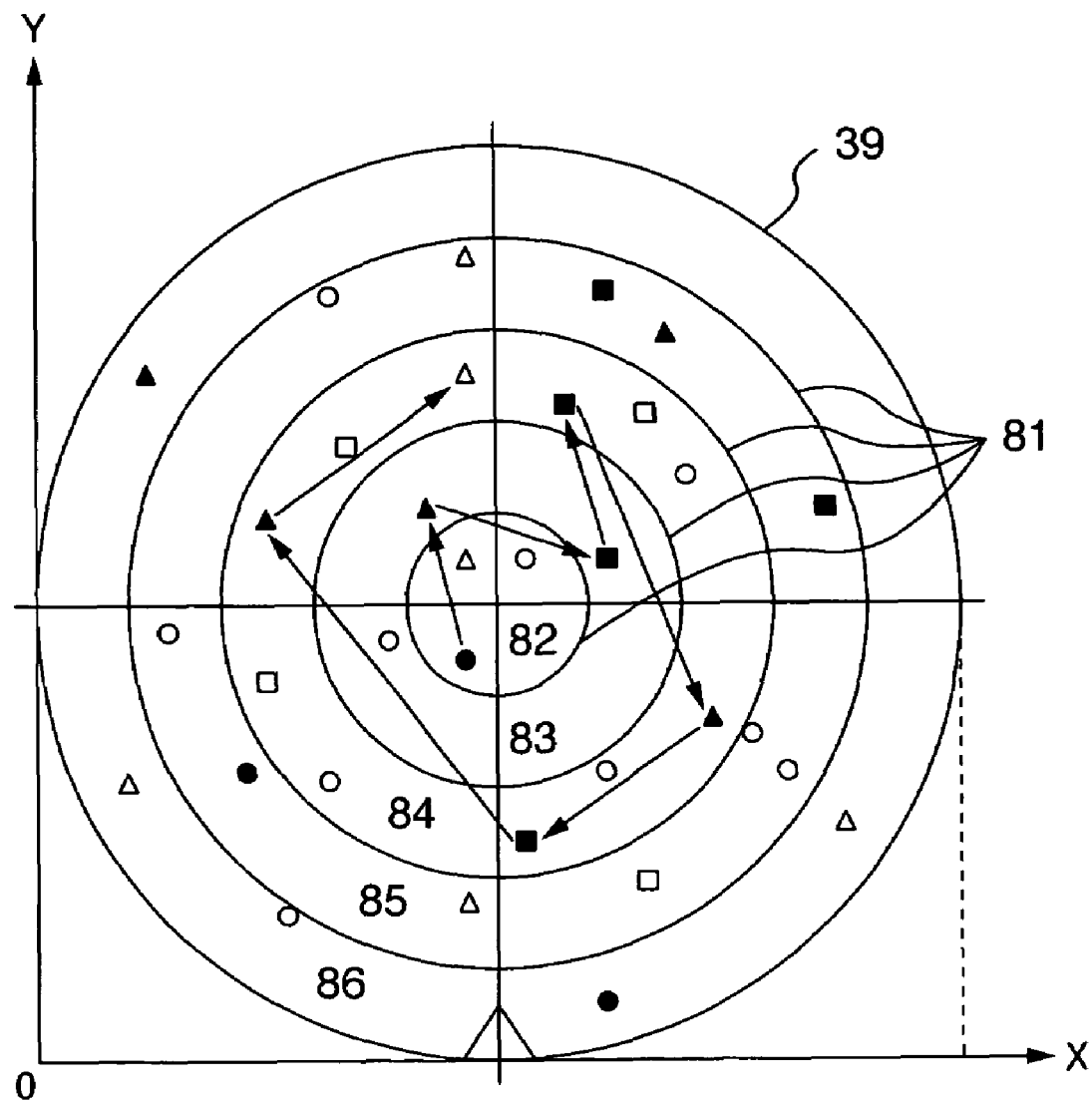
FIG. 7 is an explanatory view showing the method of selecting a defect according to the second embodiment of the present invention.

Proceeding to a step S13, the process is executed to set a boundary line surrounding the center of a wafer as shown in FIG. 7 and divide the wafer surface into a plurality of areas. Each boundary line is closed and is not crossed with another boundary line. As an example, FIG. 7 shows four concentric boundary lines 81 with the center of the wafer set as the center of the circle and five areas 82 to 86 of the wafer divided by these four boundary lines 81. The method of division and the form are not limited to those shown in FIG. 7.

In the following step S14, the process is executed to select a plurality of defects to be used for correction in each area. The number of defects may be varied in each area. As an example, FIG. 7 shows one to five defects selected in each area. A solidly shaded square, circle and triangle denote defects, respectively. It is preferable to select more defects in the closer areas to the outer periphery and select defects in a manner to allow those defects to be evenly distributed in light of a probability, though the selecting method is not limited to this method.

Then, the process is executed to set an observing sequence of the defects selected in the step S15. The exemplary selecting method is indicated below. As shown in FIG. 7, the process is executed to select one defect closest to the center from the defects included in the center area of the wafer. Then, if the selected defects are found on the same area, the process is executed to select the defects clockwise with the wafer center and determine the defect sequence. In a step S16, if no defect to be selected is found on the same area, the process is moved to the closer area by one to the outer periphery of the wafer and select the closest defect to the defect lastly selected in the previous area. Later, the process is moved toward the outer periphery of the wafer one area by one area and is executed to select defects clockwise in each area. Since this method is merely exemplary, the selecting method is not limited to this.

The boundary setting means in the step S13, the defect selecting means in the step S14, and the defect observing sequence setting means in the step S15 may be realized by the computer 16. Further, the computer 16 may offer an input screen in which the conditions of the boundary setting means, the defect selecting means and the defect observing sequence setting means or the parameters for prescribing the conditions may be entered with a keyboard or a mouse so that the user may set the conditions or the parameters in advance. The conditions of those means or the parameters for prescribing the conditions may be automatically set through the effect of the function of setting those parameters based on the history of each means or the parameters for prescribing each means, the information about defects such as distribution of defects, and the information about the defect inspection device.

In succession, in the step S7 and S8, the process is executed to measure and register the coordinate values and align the defects. This is the same as that of the first embodiment. Hence, the details thereabout is left out.

In a step S9, the process is executed to determine if the condition of terminating the registration of defects is met. According to the result, the next step is determined. The details about the step S9 are left out. If the condition of registering defects is not met, the process goes to a step S16, from which the processes of the step S16 and S7 to S9 are repeated. If the condition is met, the process is moved to the step S12 in which the defects are observed. The details about the step S12 are left out.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A scanning electron microscope comprising:
    a moving stage for moving a sample with said sample being held thereon;
    means for moving said moving stage to a location indicated by a coordinate value on a corrected coordinate system, said coordinate value being transformed from a coordinate value on a sample coordinate system about one or more foreign matters on said sample obtained by another device through the effect of a coordinates transforming expression generated in accordance with errors between a coordinate value of said foreign matters in said sample coordinate system and a coordinate value indicating actual position of said foreign matters, for observing said foreign matters; and means for selecting said foreign matters on said sample substantially spirally in the farther direction from the center of said sample with said foreign matter located closer to the center of said sample as a start point.

2. A scanning electron microscope as claimed in claim 1, wherein said coordinates transforming expression is set in a manner to reduce to a minimum an error between the coordinate values on said sample coordinate system about plural foreign matters on said sample obtained by said another device and the coordinate values on said sample coordinate system of said scanning electron microscope in which system said foreign matters are actually observed.

3. A scanning electron microscope as claimed in claim 1, wherein said means for selecting foreign matters has a function of manually setting a condition of enabling said selecting means and/or parameters for prescribing said enabling condition.

4. A scanning electron microscope as claimed in claim 1, wherein said means for selecting foreign matters has a function of automatically setting said condition of enabling said selecting means and/or parameters for prescribing said enabling condition based on any one or more of a history of said enabling condition, information about said foreign matters, information about said sample, and information about said another device.

5. A scanning electron microscope as claimed in claim 1, wherein said means for selecting foreign matters has a vector created on a specific predetermined condition, parameters for prescribing said vector, and parameters in the range of selecting said foreign matters and has a function of selecting said foreign matters on said sample in said selecting range through said vector mediated by varying said two kinds of parameters.

6. A scanning electron microscope as claimed in claim 1, wherein said means for selecting foreign matters has a function of dividing said sample into a plurality of areas defined by closed boundary lines that surround the center of said sample and are not crossed with each other, and selecting said plurality of areas from the central area to the outer area in sequence and at once said foreign matters contained in each of said areas.

7. A scanning electron microscope as claimed in claim 1, wherein said means for selecting foreign matters comprises a process of automatically terminating said selection if a specific condition is met.

8. A scanning electron microscope comprising:

a moving stage for moving a sample with said sample being held thereon;

means for moving said moving stage to a location indicated by a coordinate value on a corrected coordinate system, said coordinate value being transformed from a coordinate value on a sample coordinate system about one or more foreign matters on said sample obtained by another device through the effect of a coordinates transforming expression, for observing said foreign matters; and means for selecting said foreign matters on said sample substantially spirally in the farther direction from the center of said sample with said foreign matter located closer to the center of said sample as a start point;

wherein said means for selecting foreign matters has a function of automatically setting said condition of enabling said means for selecting and/or parameters for prescribing said enabling condition based on any one or more of a history of said enabling condition, information about said foreign matters, information about said sample, and information about said another device.

* * * * *